United States Patent
Yao et al.

(10) Patent No.: US 12,469,715 B2
(45) Date of Patent: Nov. 11, 2025

(54) DRY ETCHING WITH ETCH BYPRODUCT SELF-CLEANING

(71) Applicant: Applied Materials, Inc., Santa Clara, CA (US)

(72) Inventors: Zhonghua Yao, Santa Clara, CA (US); Qian Fu, Pleasanton, CA (US); Mark J. Saly, Santa Clara, CA (US); Yang Yang, Cupertino, CA (US); Jeffrey W. Anthis, Redwood City, CA (US); David Knapp, Santa Clara, CA (US); Rajesh Sathiyanarayanan, Bengaluru (IN)

(73) Assignee: Applied Materials, Inc., Santa Clara, CA (US)

( * ) Notice: Subject to any disclaimer, the term of this patent is extended or adjusted under 35 U.S.C. 154(b) by 251 days.

(21) Appl. No.: 18/221,063

(22) Filed: Jul. 12, 2023

(65) Prior Publication Data

US 2024/0128091 A1    Apr. 18, 2024

(30) Foreign Application Priority Data

Oct. 13, 2022  (IN) .............................. 202241058528

(51) Int. Cl.
*H01L 21/311* (2006.01)
*H01L 21/67* (2006.01)

(52) U.S. Cl.
CPC .. *H01L 21/31144* (2013.01); *H01L 21/31116* (2013.01); *H01L 21/67069* (2013.01)

(58) Field of Classification Search
None
See application file for complete search history.

(56) References Cited

U.S. PATENT DOCUMENTS

| | | |
|---|---|---|
| 5,445,712 A | 8/1995 | Yanagida |
| 7,919,005 B2 * | 4/2011 | Nakagawa ............ C04B 41/009 216/58 |
| 9,017,526 B2 | 4/2015 | Singh |
| 9,147,581 B2 | 9/2015 | Guha |
| 9,257,638 B2 | 2/2016 | Tan |

(Continued)

OTHER PUBLICATIONS

Sharma, Varun, et al., "Thermal gas-phase etching of titanium nitride (TiN) by thionyl chloride (SOCl2)", Applied Surface Science 540 (2021) 148309, Elsevier, journal homepage: www.elsevier.com/locate/apsusc, 8 pages, Available online Nov. 4, 2020.

(Continued)

*Primary Examiner* — Allan W. Olsen
(74) *Attorney, Agent, or Firm* — Lowenstein Sandler LLP

(57) ABSTRACT

A method includes providing, within an etch chamber, a base structure including a target layer disposed on a substrate, and an etch mask disposed on the target layer, dry etching, within the etch chamber, the target layer using thionyl chloride to obtain a processed base structure, and after forming the plurality of features. The processed base structure includes a plurality of features and a plurality of openings defined by the etch mask. The method further includes removing the processed base structure from the etch chamber. In some embodiments, the target layer includes carbon. In some embodiments, the dry etching is performed at a sub-zero degree temperature.

12 Claims, 5 Drawing Sheets

(56) References Cited

U.S. PATENT DOCUMENTS

| | | |
|---|---|---|
| 2008/0057724 A1 | 3/2008 | Kiehlbauch |
| 2015/0011093 A1* | 1/2015 | Singh ................ H01L 21/67213 |
| | | 438/712 |
| 2015/0079786 A1 | 3/2015 | Tan |
| 2015/0218695 A1* | 8/2015 | Odedra ................. C23C 14/564 |
| | | 134/1 |
| 2017/0314122 A1 | 11/2017 | Teo et al. |
| 2018/0096834 A1 | 4/2018 | Knapp et al. |
| 2018/0286707 A1 | 10/2018 | Hudson |
| 2020/0027746 A1* | 1/2020 | Vervuurt ........... H01L 21/31116 |
| 2021/0005472 A1 | 1/2021 | Kanarik et al. |
| 2021/0082709 A1 | 3/2021 | Tomura et al. |
| 2022/0059361 A1 | 2/2022 | Nakaya |
| 2022/0306657 A1 | 9/2022 | Fabulyak et al. |
| 2023/0074752 A1* | 3/2023 | Huang ................ H01L 21/0337 |
| 2023/0274947 A1* | 8/2023 | Arteaga Muller .......................... |
| | | H01L 21/02068 |
| | | 438/706 |
| 2025/0054768 A1* | 2/2025 | Li ....................... H01L 21/3081 |

OTHER PUBLICATIONS

International Search Report and Written Opinion for International Application No. PCT/US2023/034749, mailed Jan. 30, 2024, 12 Pages.

* cited by examiner

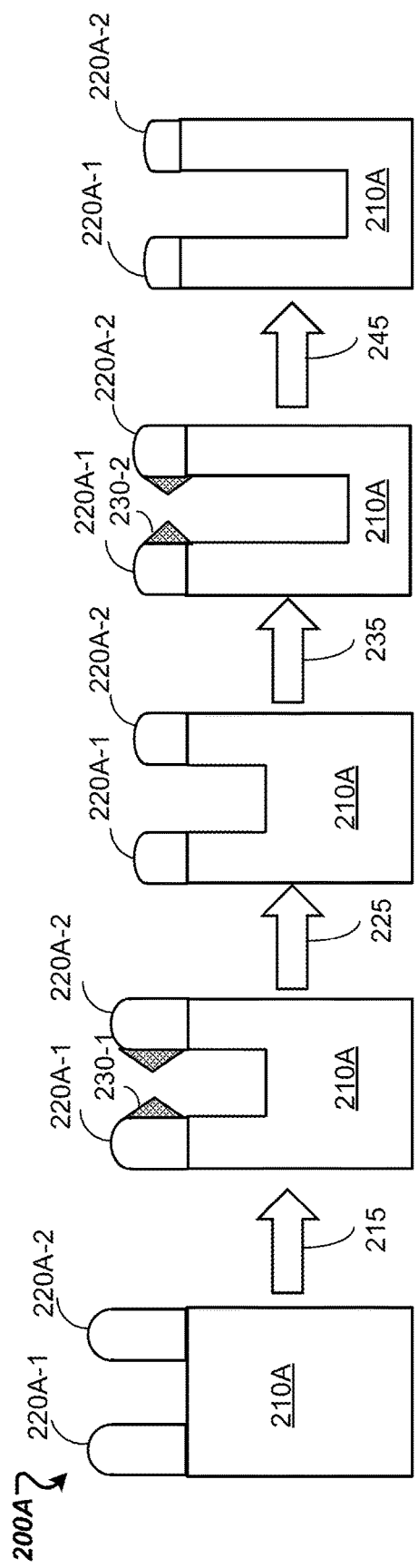
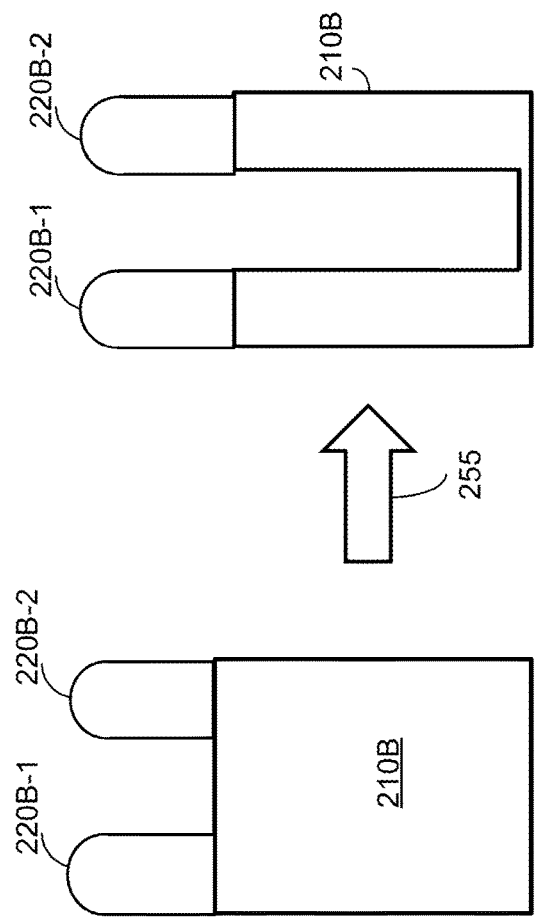

DRY ETCHING WITH ETCH BYPRODUCT SELF-CLEANING

CROSS-REFERENCE TO RELATED APPLICATION(S)

The present application claims the benefit of Indian Provisional Patent Application No. 202241058528, filed on Oct. 13, 2022 and entitled "DRY ETCHING WITH ETCH BYPRODUCT SELF-CLEANING", the entire contents of which are herein incorporated by reference.

TECHNICAL FIELD

Embodiments of the present disclosure generally relate to electronic device fabrication. Particularly, embodiments of the present disclosure relate to dry etching with etch byproduct self-cleaning.

BACKGROUND

An electronic device manufacturing apparatus can include multiple chambers, such as process chambers and load lock chambers. Such an electronic device manufacturing apparatus can employ a robot apparatus in the transfer chamber that is configured to transport substrates between the multiple chambers. In some instances, multiple substrates are transferred together. Process chambers may be used in an electronic device manufacturing apparatus to perform one or more processes on substrates, such as deposition processes and etch processes. For many processes gases are flowed into the process chamber. Electronic devices such as semiconductor devices are manufactured by performing a series of operations that may include deposition, oxidation, photolithography, ion implantation, etch, and so on to form many patterned layers.

SUMMARY

In accordance with an embodiment, a method is provided. The method includes providing, within an etch chamber, a base structure including a target layer disposed on a substrate, and an etch mask disposed on the target layer, and dry etching, within the etch chamber, the target layer using thionyl chloride to obtain a processed base structure. The target layer includes carbon. The processed base structure includes a plurality of features and a plurality of openings defined by the etch mask. The method further includes removing the processed base structure from the etch chamber.

In accordance with an embodiment, a method is provided. The method includes providing, within an etch chamber, a base structure including a target layer disposed on a substrate, and an etch mask disposed on the target layer, and dry etching, within the etch chamber at a sub-zero degree temperature, the target layer using thionyl chloride to obtain a processed base structure. The processed base structure includes a plurality of features and a plurality of openings defined by the etch mask. The method further includes removing the processed base structure from the etch chamber.

In accordance with an embodiment, an etch chamber is provided. The etch chamber includes a gas panel for providing thionyl chloride, a substrate support assembly for holding a base structure, the base structure including a target layer disposed on a substrate, and an etch mask disposed on the target layer, and a showerhead including a plurality of gas delivery holes for dry etching the target layer using the thionyl chloride to obtain a processed base structure. The target layer includes carbon. The processed base structure includes a plurality of features and a plurality of openings defined by the etch mask.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 2A is a diagram of an example method of performing dry etching using a flash process to remove etch byproducts, in accordance with some embodiments.

FIG. 2B is a diagram of an example method of performing dry etching with etch byproduct self-cleaning, in accordance with some embodiments.

DETAILED DESCRIPTION

Figure 1:
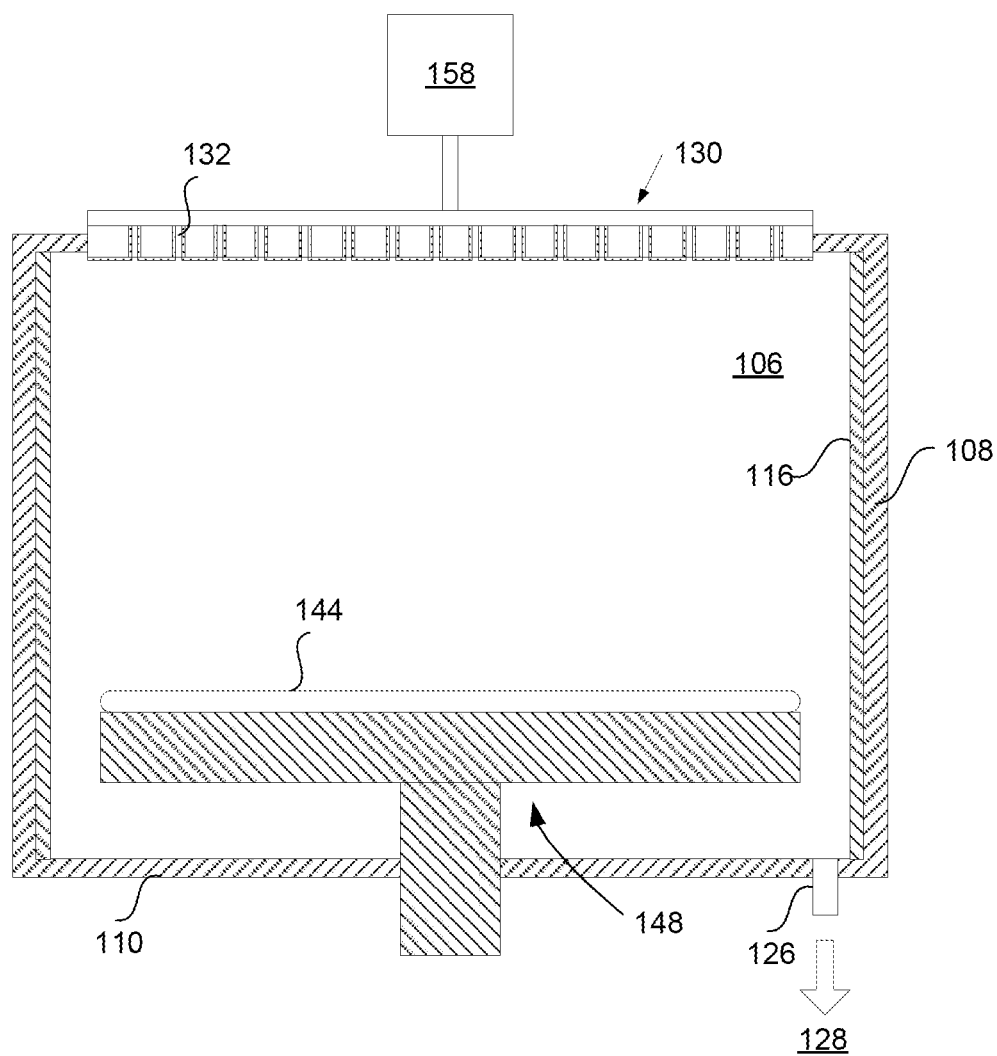
FIG. 1 a cross-sectional view of an etch chamber, in accordance with some embodiments.

Embodiments described herein relate to dry etching with etch byproduct self-cleaning. An electronic device can include a number of different types of layers. For example, an electronic device can include dielectric layers formed from a dielectric material, conductive layers formed from a conductive material, and semiconductor layers formed from a semiconductor material. Electronic device processing techniques can involve performing patterning (e.g., photolithography) to create device structures. For example, patterning can include multiple and repetitive processes of deposition and etching.

Generally, etching refers to a process for removing material from a base structure including a target layer formed on a substrate. For example, etching can be performed by forming a photoresist (e.g. "soft" etch mask) on the target layer, aligning a photomask including at least one mask layer over the photoresist, exposing the base structure to ultraviolet (UV) light while each mask layer blocks a respective region of the photoresist from being exposed to the UV light, removing at least one region of the photoresist by applying a solvent that develops the photoresist (i.e., developer) to expose at least one region of the target layer, and etching the at least one exposed region of the target layer using an etch process. After etching the at least one exposed region of the target layer, the remainder of the photoresist can be removed from the target layer using a suitable stripping chemical.

A photoresist includes a light-sensitive material (e.g., light-sensitive organic material). In some implementations, the photoresist is a positive photoresist. Positive photoresist material degrades when exposed to UV light, such that each region of the photoresist exposed to the UV light can be removed after applying the solvent. In some implementations, the photoresist is a negative photoresist. In contrast to a positive photoresist, negative photoresist material strengthens when exposed to UV light, such that each region of the photoresist that is not exposed to the UV light can be removed after applying the solvent.

In some implementations, an anti-reflective coating (ARC) layer can be formed on the target layer prior to forming the photoresist. That is, the ARC layer can be referred to as a bottom ARC (BARC) layer. The ARC layer can prevent reflections of the UV light from occurring underneath the photoresist. Accordingly, the ARC layer can improve photoresist performance, particularly as feature sizes decrease (i.e., at smaller technology nodes).

Alternatively, a hardmask can be used instead of the photoresist. For example, a hardmask can be used when the underlying material to be etched is an organic material (e.g., organic polymer), since the etchant used to etch the underlying material would also etch the photoresist. Additionally or alternatively, a hardmask can be used when the target layer underneath the hardmask is formed from a material that may be damaged by the chemicals used to strip the photoresist (e.g., a low-k dielectric material). Hardmasks can be formed from any suitable inorganic materials or organic materials. Hardmasks can be formed from suitable conductive materials (e.g., metals), dielectric materials, etc. Examples of hardmask materials include silicon-based materials (e.g., silicon dioxide ($SiO_2$), silicon carbide (SiC), silicon oxynitride (SiON)), metal-nitride-based materials, metal-oxide-based materials, carbon-based materials, organosiloxane-based materials, etc.

One example of etching is wet etching (i.e., liquid-phase etching). During wet etching, a wet etch chemistry is used to remove material from the target layer. Another example of etching is dry etching. Examples of dry etching include gas-phase etching and plasma-phase etching. Gas-phase etching removes material from the target layer using a gas mixture at sufficiently high temperatures. Plasma-phase ("plasma") removes material using plasma generated from a gas mixture at lower temperatures. Examples of plasma etching include isotropic plasma etching, ion beam milling or sputter etching, reactive-ion etching (RIE), etc.

Plasma can be generated from a process gas. The plasma can include reactive species such as charged particles (e.g., ions) and/or neutral particles (e.g., atoms and/or radicals). The surface of the at least one exposed region of the target layer reacts with the plasma, which results in the etching of the exposed portions of the target layer. The type of process gas within the gas mixture is dependent on the material of the target layer. The reactions between the target layer and the reactive species can generate volatile etch byproducts (e.g., smaller molecules), which can be removed by a vacuum system.

In some implementations, the process gas is delivered within a gas mixture that further includes a carrier gas. More specifically, the carrier gas can be an inert gas. For example, a carrier gas can be a noble gas, such as helium (He), argon (Ar), neon (Ne), xenon (Xe), krypton (Kr), radon (Rn), etc. In some implementations, the gas mixture can include a mixture of carrier gases (i.e a carrier gas mixture). The carrier gas (or carrier gas mixture) can be used to dilute the gas mixture to control etch rate or improve etch performance.

In some implementations, the process gas is delivered without a carrier gas. For example, the process gas can be delivered via heated gas lines.

As described above, an etch mask can be disposed on the target layer, where the etch mask defines features to be formed from the target layer. After a dry etch pulse, etch byproducts or residue can form on the sidewalls of the etch mask and/or of the sidewalls of features within the target layer. More specifically, the etch products can form within openings formed between features. An opening can be formed in at least a top surface of the target layer and/or in the bottom surface of the target layer. In some embodiments, an opening is a via hole. The etch byproducts can form at least in part due to sputtering of the mask material (e.g., silicon (Si)). For example, the etch byproducts can include a silicon oxide material (e.g., $SiO_2$). More specifically, during the bias power off time during the dry etching, the sputtered material can recombine on the surface of the sidewalls of the etch mask and/or target layer.

In the case of an opening and/or feature with sufficiently small widths (e.g., critical dimensions), etch byproducts can cause blockage or clogging of the opening after an etch cycle. The clogging can prevent additional dry etch processes (e.g., pulses/cycles) from being performed. Typically, the etch byproducts can be removed by performing a cleaning process after each etch pulse, also referred to as a "flash" process. The etch pulse and the flash process can form an etch cycle that repeats until sufficient material is removed from the target layer (e.g., the features reach a target height). However, having to perform the flash process after each etch pulse can extend processing time and reduce throughput. Moreover, the flash process can, in addition to removing the etch byproducts, remove portions of the etch mask formed on the target layer. Therefore, the number of times that the flash process can be performed is finite and limited by the thickness of the etch mask. Moreover, over-passivation can result due to performing dry etching at sub-zero degree temperatures (e.g., less than about 0° C.). This can negatively affect the etch profile of features formed from the target layer during dry etching.

To address these and other drawbacks, embodiments described herein can enable plasma etching with etch byproduct self-cleaning. For example, the gas mixture used during the plasma etching can include a process gas including thionyl chloride ($SOCl_2$). In some embodiments, the target layer includes a polymer. In some embodiments, the target layer is a hardmask. In some embodiments, the target layer is a photoresist. For example, the target layer can be disposed on a dielectric layer (e.g., an oxide). In some embodiments, the target layer includes carbon (C). For example, the target layer can include amorphous deposited carbon, spin-on carbon, CVD deposited carbon, etc.

An etch mask can be formed on the target layer. The etch mask can include a material that enables formation of the features from the target layer using dry etching with thionyl chloride. In some embodiments, the etch mask is a silicon-containing etch mask. For example, the etch mask can include silicon oxynitride (SiON). In some embodiments, the etch mask is a boron-containing etch mask. For example, the etch mask can include boron nitride (BN).

In some embodiments, the target layer can have dimensions (e.g., thickness and width) to enable the formation of high aspect ratio features. Aspect ratio refers to the ratio of the height of a feature to the width of the feature (e.g., critical dimension). A feature can have any suitable aspect ratio in accordance with embodiments described herein. In some implementations, a high aspect ratio feature can have a height-to-width ratio of greater than or equal to about 30:1. In some embodiments, a high aspect ratio feature can have a height-to-width ratio of greater than or equal to about 40:1. In some embodiments, a high aspect ratio feature can have a height-to-width ratio of greater than or equal to about 50:1.

In some embodiments, a high aspect ratio feature can have a height-to-width ratio of greater than or equal to about 60:1. For example, the length of a feature can be about 1000 nanometers (nm) and the width of the feature can be about 16 nm (e.g., an aspect ratio of about 62.5:1).

The features formed from the target layer can include any suitable width in accordance with embodiments described herein. In some embodiments, the width of a feature can be less than or equal to about 50 nm. In some embodiments, the width of a feature can be less than or equal to about 40 nm. In some embodiments, the width of a feature can be less than or equal to about 30 nm. In some embodiments, the width of a feature can be less than or equal to about 20 nm.

The thionyl chloride can enable self-cleaning of etch byproducts that would be formed on the sidewalls of the etch mask and/or sidewalls of features formed from the target layer. For example, if the target layer includes H (e.g., a material including C and H), then the H from the target layer can be scavenged to form HCl. The HCl can clean the etch byproducts and can smooth exposed surfaces. Accordingly, embodiments described herein can reduce the number of flash processes that need to be performed to remove etch byproducts from the sidewalls of the etch mask and/or the target layer (e.g., eliminate flash processes).

Moreover, the thionyl chloride can cause chemical adsorption (i.e., chemisorption) at the surface of the sidewall of features formed from the target layer, which can improve surface quality (e.g., remove surface roughness) and passivate the surface of the sidewalls of the features. For example, if the target layer includes carbon, then the sulfur (S) from the thionyl chloride can react with the C from the target layer to form a passivation layer including carbon disulfide ($CS_2$) on the surface of the sidewalls of the features. The presence of the passivation layer can reduce etching of the passivated surface and reduce a roughness of the passivated surface. The improved smoothness can lead to improved circularity of surfaces resulting from the dry etching, such as dry etching performed at sub-zero degree temperatures. Thus, embodiments described herein can achieve sidewall passivation during the dry etching with the thionyl chloride gas mixture, without using an additional passivation gas, such as carbonyl sulfide (COS) or sulfur dioxide ($SO_2$). Accordingly, an improved etch profile can be achieved by performing dry etching using the thionyl chloride gas mixture described herein.

The dry etching can be performed at any suitable temperature. In some embodiments, the dry etching is performed at a sub-zero degree temperature. As an etchant, the thionyl chloride gas mixture can counteract the over-passivation that can result from dry etching at a sub-zero degree temperature. For example, the dry etching can be performed at a temperature of less than about 0° C. As another example, the dry etching can be performed at a temperature of less than or equal to about −10° C. As another example, the dry etching can be performed at a temperature of less than or equal to about −20° C. As another example, the dry etching can be performed at a temperature of less than or equal to about −30° C. As yet another example, the dry etching can be performed at a temperature of less than or equal to about −40° C. As yet another example, the dry etching can be performed at a temperature of less than or equal to about −50° C. As yet another example, the dry etching can be performed at a temperature of less than or equal to about −60° C. As yet another example, the dry etching can be performed at a temperature of less than or equal to about −70° C. As yet another example, the dry etching can be performed at a temperature of less than or equal to about −80° C. As yet another example, the dry etching can be performed at a temperature of less than or equal to about −90° C. If a carrier gas is included in a gas mixture with the process gas, then the carrier gas can propel the process gas flow into the etch chamber at a normal speed and prevent thionyl gas condensation at sub-zero degree temperatures. In some embodiments, the dry etching is performed at an above-zero-degree temperature. More particularly, the dry etching can be performed at a temperature of greater than about 0° C. Further details regarding performing dry etching with etch byproduct self-cleaning will be described below with reference to FIGS. 1-3.

FIG. 1 is a cross-sectional view of an etch chamber 100, in accordance with some embodiments. The etch chamber 100 may be used for etch processes in which a corrosive plasma environment and/or corrosive chemistry is provided. For example, the etch chamber 100 may be a chamber for a plasma etch reactor (also known as a plasma etcher). Examples of chamber components that may be exposed to plasma in the etch chamber 100 are a substrate support assembly 148, an electrostatic chuck (ESC), a ring (e.g., a process kit ring or single ring), a chamber wall, a base, a showerhead 130, a gas distribution plate, a liner, a liner kit, a shield, a plasma screen, a flow equalizer, a cooling base, a chamber viewport, a chamber lid, a nozzle, process kit rings, and so on.

In one embodiment, the etch chamber 100 includes a chamber body 102 and a showerhead 130 that enclose an interior volume 106. The showerhead 130 may or may not include a gas distribution plate. For example, the showerhead may be a multi-piece showerhead that includes a showerhead base and a showerhead gas distribution plate bonded to the showerhead base. Alternatively, the showerhead 130 may be replaced by a lid and a nozzle in some embodiments, or by multiple pie shaped showerhead compartments and plasma generation units in other embodiments. The etch chamber body 102 may be fabricated from aluminum, stainless steel or other suitable material. The etch chamber body 102 generally includes sidewalls 108 and a bottom 110. Any of the showerhead 130 (or lid and/or nozzle), sidewalls 108 and/or bottom 110 may include the multi-layer plasma resistant coating.

An outer liner 116 may be disposed adjacent the sidewalls 108 to protect the etch chamber body 102. The outer liner 116 may be a halogen-containing-gas resist material such as $Al_2O_3$ or $Y_2O_3$. The outer liner 116 may be coated with the multi-layer plasma resistant ceramic coating in some embodiments.

An exhaust port 126 may be defined in the etch chamber body 102, and may couple the interior volume 106 to a pump system 128. The pump system 128 may include one or more pumps and throttle valves utilized to evacuate and regulate the pressure of the interior volume 106 of the etch chamber 100.

The showerhead 130 may be supported on the sidewalls 108 of the etch chamber body 102 and/or on a top portion of the etch chamber body. The showerhead 130 (or lid) may be opened to allow access to the interior volume 106 of the etch chamber 100, and may provide a seal for the etch chamber 100 while closed. A gas panel 158 may be coupled to the etch chamber 100 to provide a gas mixture including at least one process gas and/or at least one carrier gas to the interior volume 106 through the showerhead 130 or lid and nozzle. Examples of process gas that may be delivered by the gas panel 158 and used to process substrates/samples in the etch chamber 100 include thionyl chloride. Examples of carrier gases (e.g., diluents) include inert gases (e.g., noble gases).

The showerhead 130 includes multiple gas delivery holes 132 throughout the showerhead 130. The showerhead 130 may be or may include aluminum, anodized aluminum, an aluminum alloy (e.g., Al 6061), or an anodized aluminum alloy. In some embodiments, the showerhead includes a gas distribution plate bonded to the showerhead. The gas distribution plate may be, for example, Si or SiC. The gas distribution plate may additionally include multiple holes that line up with the holes in the showerhead.

A substrate support assembly 148 is disposed in the interior volume 106 of the etch chamber 100 below the showerhead 130. The substrate support assembly 148 holds a base structure 144 including a substrate during processing. The substrate support assembly 148 may include an electrostatic chuck that secures the base structure 144 during processing, a metal cooling plate bonded to the electrostatic chuck, and/or one or more additional components. An inner liner may cover a periphery of the substrate support assembly 148. The inner liner may be a halogen-containing-gas resist material such as $Al_2O_3$ or $Y_2O_3$. The substrate support assembly 148, portions of the substrate support assembly 148, and/or the inner liner may be coated with the metal layer and barrier layer in some embodiments.

The etch chamber 100 may be configured to perform dry etching with etch byproduct self-cleaning, as described in further detail below with reference to FIGS. 2A-5. More specifically, the dry etching can be performed to etch a target layer of the base structure 144. In some embodiments, the target layer includes a polymer. In some embodiments, the target layer is a hardmask. In some embodiments, the target layer is a photoresist. For example, the target layer can be disposed on a dielectric layer (e.g., an oxide). In some embodiments, the target layer includes carbon. For example, the target layer can include amorphous deposited carbon, spin-on carbon, CVD deposited carbon, etc.

In some embodiments, the target layer is disposed on a dielectric layer. For example, the target layer can be disposed on a dielectric layer including an oxide material. In some embodiments, the dry etching is performed at a sub-zero degree temperature. For example, the dry etching can be performed at a temperature of less than about 0° C. As another example, the dry etching can be performed at a temperature of less than or equal to about −10° C. As another example, the dry etching can be performed at a temperature of less than or equal to about −20° C. As another example, the dry etching can be performed at a temperature of less than or equal to about −30° C. As yet another example, the dry etching can be performed at a temperature of less than or equal to about −40° C.

For example, the base structure 144 can include an etch mask stack disposed on the target layer, and the target layer can be disposed on at least one layer of substrate. In some embodiments, the etch mask stack includes a photoresist, a BARC layer and an etch mask. In some embodiments, the at least one layer of the substrate includes a dielectric layer (e.g., oxide). The etch mask can include a material that enables the formation of the features from the target layer during the dry etching using thionyl chloride. In some embodiments, the etch mask is a silicon-containing etch mask. For example, the etch mask can include SiON. In some embodiments, the etch mask is a boron-containing etch mask. For example, the etch mask can include BN.

In some embodiments, the substrate includes a substrate layer (e.g., the dielectric layer is disposed between the target layer and the substrate layer). For example, the substrate layer can be a silicon (Si) substrate layer, a glass substrate layer, a silicon-germanium (SiGe) substrate layer (e.g., a stack of alternating sublayers of Si and Ge), etc. Further details regarding performing dry etching with etch byproduct self-cleaning will now be described below with reference to FIGS. 2A-5.

FIG. 2A is a diagram of an example method 200A of performing dry etching using a flash process to remove etch byproducts. Initially, a base structure is provided including a target layer 210A and etch mask layers 220A-1 and 220A-2 disposed on the target layer 210A.

At step 215, a portion of material of the target layer 210A is removed using a dry etch process (e.g., dry etch pulse/cycle). For example, the dry etch process can include at least one of plasma etching, ion beam milling, RIE, etc. More specifically, the portion of material removed from the target layer 210A is within a region not protected by the etch mask layers 220A-1 and 220A-2. The dry etch process results in the formation of etch byproducts 230-1 at least on the sidewalls of the etch mask layers 220A-1 and 220A-2. Although not shown, the etch byproducts 230-1 can also be formed on the sidewalls of the target layer 210A. Due to the geometry of the features and openings (e.g., high aspect ratio and/or widths), the etch byproducts can lead to clogs of the openings, which can prevent further dry etching from being performed. At step 225, the etch byproducts 230-1 are removed by performing a flash process. As further shown, the flash process also removes a portion of the etch mask layers 220A-1 and 220A-2.

At step 235, another portion of the target layer 210A is removed using another dry etch process (similar to step 215). The dry etch process results in the formation of etch byproducts 230-2 at least on the sidewalls of the etch mask layers 220A-1 and 220A-2. Although not shown, the etch byproducts 230-2 can also be formed on the sidewalls of the target layer 210A. At step 245, the etch byproducts 230-1 are removed by performing another flash process. As further shown, the flash process also removes another portion of the etch mask layers 220A-1 and 220A-2.

The process of removing portions of the target layer 210A using dry etching and then removing etch byproducts resulting therefrom can continue until the features are completed. However, the process of removing the etch byproducts is time consuming and can reduce throughput. Moreover, the flash process can remove portions of the etch mask, which limits the number of dry etching pulses/cycles that can be performed. Thus, as will be now be described below with reference to FIG. 2B, embodiments described herein can enable dry etching to be performed with etch byproduct self-cleaning.

FIG. 2B is a diagram of an example method 200B of performing dry etching with etch byproduct self-cleaning, in accordance with some embodiments. Initially, a base structure is provided including a target layer 210B and etch mask layers 220B-1 and 220B-2 disposed on the target layer 210B.

The target layer 210B can include any suitable material. In some embodiments, the target layer 210B includes a polymer. In some embodiments, the target layer 210B is a hardmask. In some embodiments, the target layer 210B is a photoresist. For example, the target layer 210B can be a hardmask disposed on a dielectric layer (e.g., an oxide). In some embodiments, the target layer 210B includes carbon. For example, the target layer 210B can include amorphous deposited carbon, spin-on carbon, CVD deposited carbon, etc.

The etch mask layers 220B-1 and 220B-2 can include any suitable material that enables the formation of the features from the target layer during the dry etching using thionyl chloride. In some embodiments, the etch mask layers 220B-1 and 220B-2 are silicon-containing etch mask layers. For example, the etch mask layers 220B-1 and 220B-2 can include SiON. In some embodiments, the etch mask layers 220B-1 and 220B-2 are boron-containing etch mask layers. For example, the etch mask layers 220B-1 and 220B-2 can include BN.

In some implementations, the target layer 210B can have a thickness to enable the formation of high aspect ratio features. In some embodiments, the target layer 210B has a thickness ranging from about 2 micrometers (µm) to about 20 µm. In some embodiments, the target layer 210B has a thickness ranging from about 3 µm to about 10 µm. In some embodiments, the target layer 210B has a thickness ranging from about 4 µm to about 6 µm.

In some embodiments, a high aspect ratio feature can have a height-to-width ratio of greater than or equal to about 40:1. In some embodiments, a high aspect ratio feature can have a height-to-width ratio of greater than or equal to about 50:1. In some embodiments, a high aspect ratio feature can have a height-to-width ratio of greater than or equal to about 60:1. For example, the length of a feature can be about 1000 nm and the width of the feature can be about 16 nm (e.g., an aspect ratio of about 62.5:1).

The features formed from the target layer can include any suitable width (e.g., critical dimension) in accordance with embodiments described herein. In some embodiments, the width of a feature can be less than or equal to about 50 nanometers (nm). In some embodiments, the width of a feature can be less than or equal to about 40 nm. In some embodiments, the width of a feature can be less than or equal to about 30 nm. In some embodiments, the width of a feature can be less than or equal to about 20 nm.

At step 255, a portion of the target layer 210B is removed using dry etching to form features. Examples of dry etching include plasma etching, ion beam milling, RIE, etc. For example, the dry etching can include a suitable number of dry etch processes (e.g., dry etch pulses/cycles). More specifically, the portion of the target layer 210B is within a region not protected by the etch mask layers 220B-1 and 220B-2.

The dry etching can utilize at least one process gas that can remove etch byproducts. More specifically, the at least one process gas can include thionyl chloride. In some embodiments, the process gas is delivered within a gas mixture that further includes at least one carrier gas. More specifically, the at least one carrier gas can include at least one inert gas. For example, the at least one carrier gas can include a noble gas (e.g., He, Ar, Ne, Xe, Kr, Rn). In some embodiments, the process gas is delivered without a carrier gas. For example, the process gas can be delivered via heated gas lines.

The thionyl chloride can enable self-cleaning of etch byproducts that would be formed on the sidewalls of the etch mask and/or the target layer. For example, if the target layer includes H (e.g., a material including C and H), then the H from the target layer can be scavenged to form HCl. The HCl can clean the etch byproducts and can smoothen the etching front surface. Accordingly, embodiments described herein can reduce (e.g., eliminate) the number of flash processes that need to be performed to remove etch byproducts from the sidewalls of the etch mask and/or the target layer.

Moreover, the thionyl chloride can cause chemical adsorption (i.e., chemisorption) at the surface of the sidewall of features formed from the target layer, which can improve surface roughness and passivate the surface of the sidewalls of the features. For example, if the target layer includes carbon, then the S from the thionyl chloride can react with the C from the target layer to form a passivation layer including $CS_2$ on the surface of the sidewalls of the features. The improved smoothness can lead to improved circularity of surfaces resulting from the dry etching, such as dry etching performed at sub-zero degree temperatures. Thus, sidewall passivation can be achieved during the dry etching with the thionyl chloride gas mixture, without using an additional passivation gas, such as COS or $SO_2$. Accordingly, an improved etch profile can be achieved by performing dry etching using the thionyl chloride gas mixture described herein.

The dry etching can be performed at any suitable temperature. In some embodiments, the dry etching is performed at a sub-zero degree temperature. For example, the dry etching can be performed at a temperature of less than about 0° C. As another example, the dry etching can be performed at a temperature of less than or equal to about −10° C. As another example, the dry etching can be performed at a temperature of less than or equal to about −20° C. As another example, the dry etching can be performed at a temperature of less than or equal to about −30° C. As yet another example, the dry etching can be performed at a temperature of less than or equal to about −40° C. As yet another example, the dry etching can be performed at a temperature of less than or equal to about −50° C. As yet another example, the dry etching can be performed at a temperature of less than or equal to about −60° C. As yet another example, the dry etching can be performed at a temperature of less than or equal to about −70° C. As yet another example, the dry etching can be performed at a temperature of less than or equal to about −80° C. As yet another example, the dry etching can be performed at a temperature of less than or equal to about −90° C. If a carrier gas is included in a gas mixture with the process gas, then the carrier gas can propel the process gas flow into the etch chamber at a normal speed and prevent thionyl gas condensation at sub-zero degree temperatures. In some embodiments, the dry etching is performed at an above-zero-degree temperature. For example, the dry etching can be performed at a temperature of greater than about 0° C.

In contrast to the method 200A of FIG. 2A, a reduced number of flash processes are performed to remove etch byproducts from the sidewalls of the target layer 210B and/or the sidewalls of the etch mask layers 220B-1 and 220B-2. In some embodiments, zero flash processes need to be performed to remove the etch byproducts. Further details regarding performing dry etching with etch byproduct self-cleaning will now be described below with reference to FIG. 3.

Figure 3:
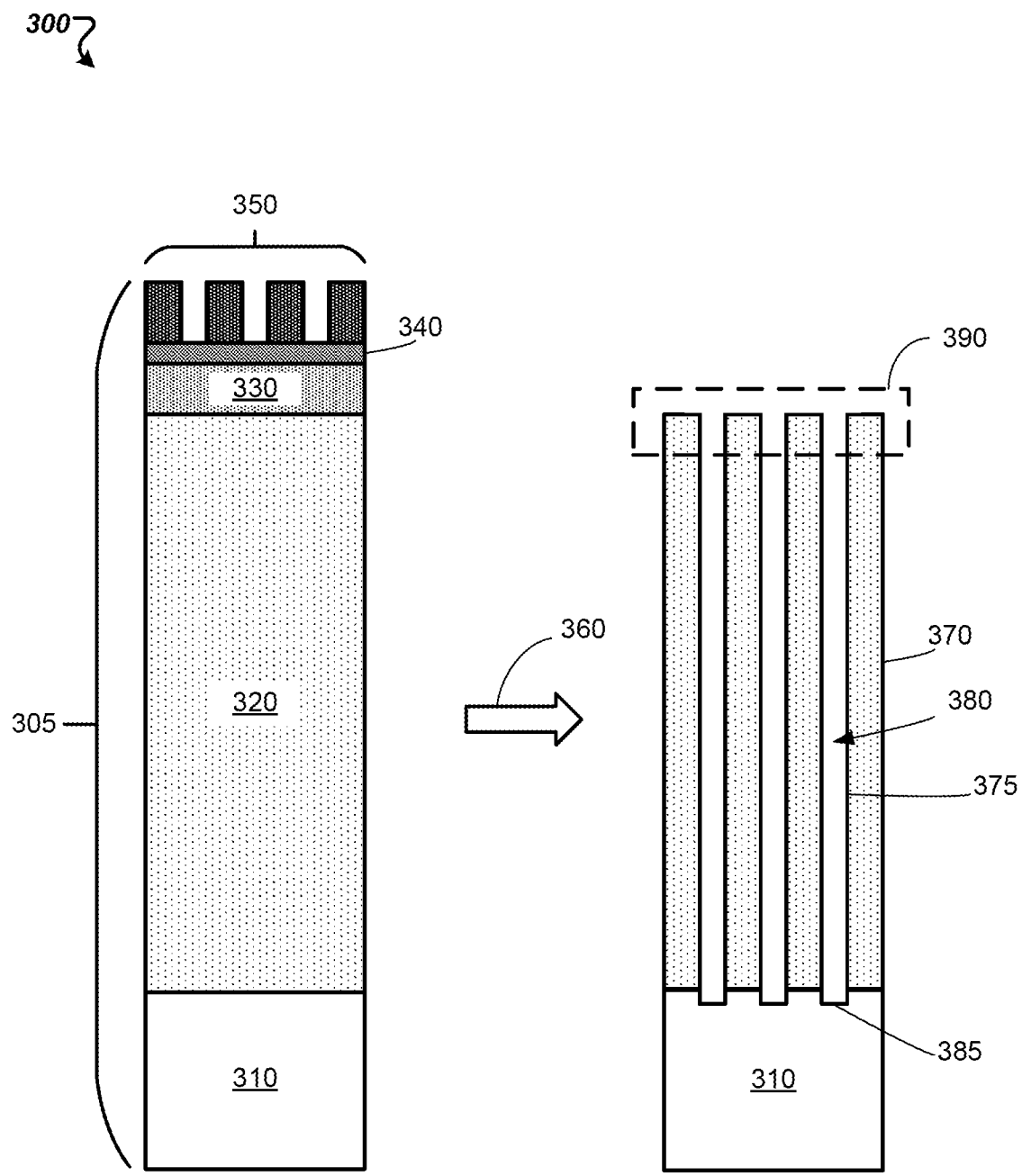
FIG. 3 is a diagram of an example method of performing dry etching with etch byproduct self-cleaning, in accordance with some embodiments.

FIG. 3 is a diagram 300 of an example method of performing dry etching with etch byproduct self-cleaning, in accordance with some embodiments. As shown, a base structure 305 is provided. The base structure 305 includes a layer 310, a target layer 320 disposed on the layer 310, an etch mask 330, a BARC layer 340 disposed on the etch mask 330, and a photoresist 350 disposed on the BARC layer 340.

The layer 310 can include any suitable material. In some embodiments, the layer 310 includes a dielectric material. For example, the layer 310 can include an oxide (e.g., a metal oxide).

The target layer 320 can include any suitable material. In some embodiments, the target layer 320 includes a polymer. In some embodiments, the target layer 320 is a hardmask. In some embodiments, the target layer 320 is a photoresist. For example, the target layer 320 can be disposed on a dielectric layer (e.g., an oxide). In some embodiments, the target layer

320 includes carbon. For example, the target layer 320 can include amorphous deposited carbon, spin-on carbon, CVD deposited carbon, etc.

In some implementations, the target layer 320 can have a thickness to enable the formation of high aspect ratio features and/or features with sufficiently small widths. In some embodiments, the target layer 320 has a thickness ranging from about 2 micrometers (μm) to about 20 μm. In some embodiments, the target layer 320 has a thickness ranging from about 3 μm to about 10 μm. In some embodiments, the target layer 320 has a thickness ranging from about 4 μm to about 6 μm.

In some implementations, a high aspect ratio feature can have a height-to-width ratio of greater than or equal to about 30:1. In some embodiments, a high aspect ratio feature can have a height-to-width ratio of greater than or equal to about 40:1. In some embodiments, a high aspect ratio feature can have a height-to-width ratio of greater than or equal to about 50:1. In some embodiments, a high aspect ratio feature can have a height-to-width ratio of greater than or equal to about 60:1. For example, the length of a feature can be about 1000 nm and the width of the feature can be about 16 nm (e.g., an aspect ratio of about 62.5:1).

The etch mask 330 can include any suitable material that enables the formation of the features from the target layer during the dry etching using thionyl chloride. In some embodiments, the etch mask 330 is a silicon-containing etch mask. For example, the etch mask can include SiON. In some embodiments, the etch mask 330 is a boron-containing etch mask. For example, the etch mask 330 can include BN. The BARC layer 340 can include any suitable ARC material. In some embodiments, the photoresist 350 is a positive photoresist. In some embodiments, the photoresist 350 is a negative photoresist.

Drying etching can be performed at step 360. For example, the dry etching can include a plasma etching, ion beam milling, RIE, etc. At least one process gas can be used to perform the dry etching. More specifically, the at least one process gas can include thionyl chloride. In some embodiments, the process gas is delivered within a gas mixture that further includes at least one carrier gas. More specifically, the at least one carrier gas can include at least one inert gas. For example, the at least one carrier gas can include a noble gas (e.g., He, Ar, Ne, Xe, Kr, Rn). In some embodiments, the process gas is delivered without a carrier gas. For example, the process gas can be delivered via heated gas lines.

The dry etching performed at step 360 results in the formation of a number of features 370 having sidewalls 375 and a number of openings 380, where each opening 380 separates a pair of features 370. As further shown, a portion of the layer 310 is removed during the dry etching, resulting in surfaces 385. More specifically, the features 370 are high aspect ratio features and/or have sufficiently small widths. For example, each of the features 370 can have a height-to-width ratio of greater than or equal to about 100:1.

The dry etching can be performed at any suitable temperature. In some embodiments, the dry etching is performed at a sub-zero degree temperature. For example, the dry etching can be performed at a temperature of less than about 0° C. As another example, the dry etching can be performed at a temperature of less than or equal to about −10° C. As another example, the dry etching can be performed at a temperature of less than or equal to about −20° C. As another example, the dry etching can be performed at a temperature of less than or equal to about −30° C. As yet another example, the dry etching can be performed at a temperature of less than or equal to about −40° C. As yet another example, the dry etching can be performed at a temperature of less than or equal to about −50° C. As yet another example, the dry etching can be performed at a temperature of less than or equal to about −60° C. As yet another example, the dry etching can be performed at a temperature of less than or equal to about −70° C. As yet another example, the dry etching can be performed at a temperature of less than or equal to about −80° C. As yet another example, the dry etching can be performed at a temperature of less than or equal to about −90° C. If a carrier gas is included in a gas mixture with the process gas, then the carrier gas can propel the process gas flow into the etch chamber at a normal speed and prevent thionyl gas condensation at sub-zero degree temperatures. In some embodiments, the dry etching is performed at an above-zero-degree temperature. For example, the dry etching can be performed at a temperature of greater than about 0° C.

The use of thionyl chloride during dry etching can enable self-cleaning of etch byproducts that would be formed on the sidewalls 375. For example, if the target layer 320 includes H (e.g., a material including C and H), then H from the target layer 320 can be scavenged to form HCl. The HCl can clean the etch byproducts and can smoothen the etching front surface. Moreover, the thionyl chloride can cause chemical adsorption (i.e., chemisorption) at the surface of the sidewalls 375, which can improve surface roughness and passivate the surface of the sidewalls 375. For example, if the target layer 320 includes carbon, then the S from the thionyl chloride can react with the C of the target layer 320 to form a passivation layer including $CS_2$ on the surface of the sidewalls 375. The improved smoothness can lead to improved circularity of surfaces 385 resulting from the dry etching, such as dry etching performed at sub-zero degree temperatures. Thus, sidewall passivation can be achieved during the dry etching with the thionyl chloride gas mixture, without using an additional passivation gas, such as COS or $SO_2$. Accordingly, an improved etch profile can be achieved by performing dry etching using the thionyl chloride gas mixture described herein. Further details regarding improved circularity of the surfaces 385 will now be described below with reference to FIGS. 4A-4B.

Figure 4A:
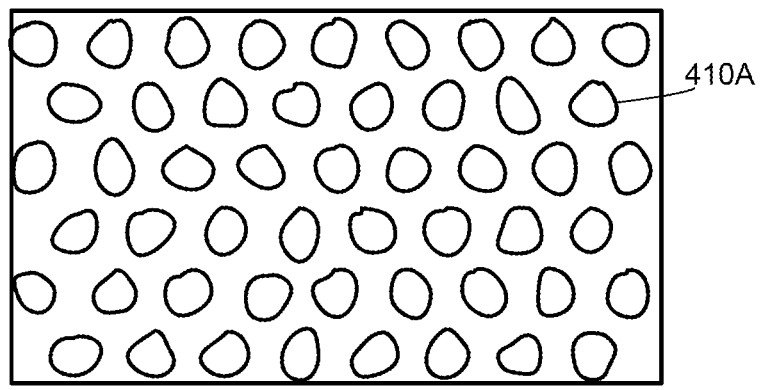
FIGS. 4A-4B are diagrams of an example lower profiles caused by performing dry etching, in accordance with some embodiments.
Figure 4B:
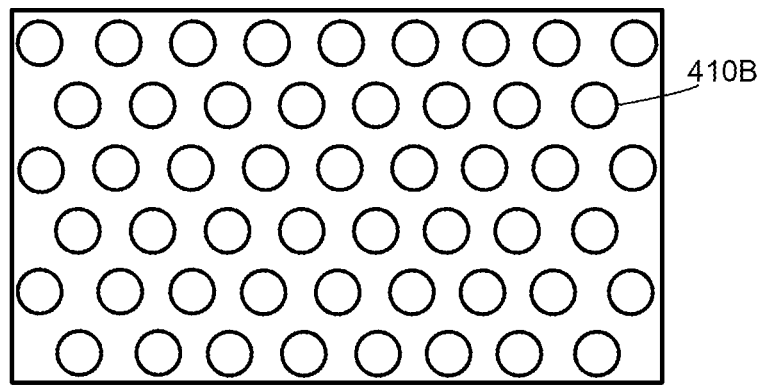

FIG. 4A is a diagram 400A of an example bottom critical dimension profile caused by performing plasma etching without thionyl chloride, and FIG. 4B is a diagram 400B of an example method of performing dry etching with etch byproduct self-cleaning using thionyl chloride, in accordance with some embodiments. More specifically, diagram 400A shows a lower profile of number of openings (e.g., vias) including opening 410A, and diagram 400B shows a lower profile of number of openings including opening 410B. For example, opening 410B can be similar to the opening 380 of the lower profile 390-2 described above with reference to FIG. 3. The opening 410B, which was formed in accordance with the method described above with reference to FIGS. 2-3, has improved circularity and an improved etch profile as compared to the opening 410A.

Figure 5:
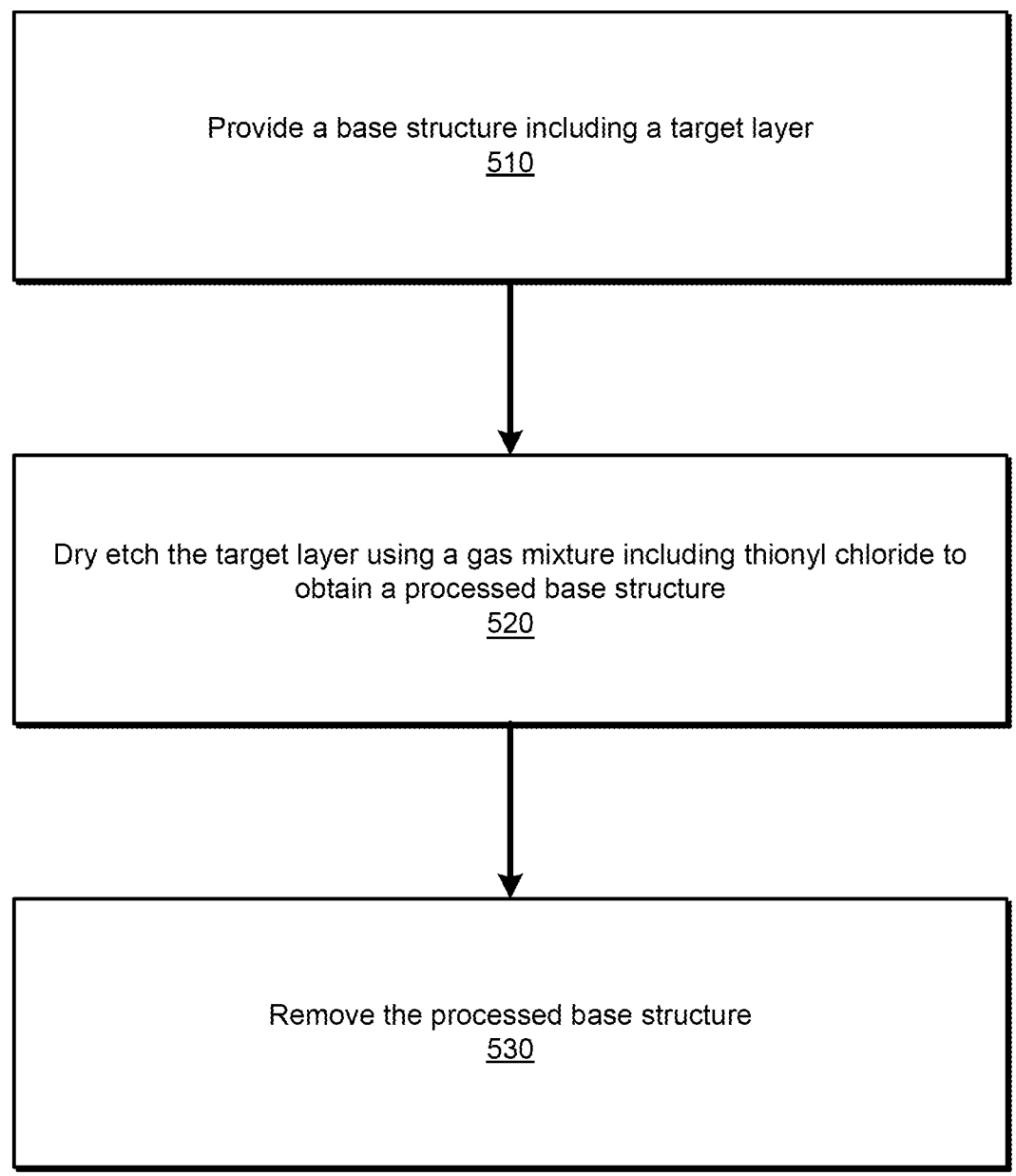
FIG. 5 is a flowchart of an example method of performing dry etching with etch byproduct self-cleaning, in accordance with some embodiments.

FIG. 5 is a flowchart of an example method 500 of performing dry etching with etch byproduct self-cleaning, in accordance with some embodiments. For example, the method 500 can be performed with an etch chamber, such as the etch chamber 100 described above with reference to FIG. 1.

At block 510, a base structure including a target layer is provided. For example, the base structure can be received by a substrate support assembly of the etch chamber for holding the base structure. The target layer can have a thickness to enable the formation of high aspect ratio features and/or features with sufficiently small widths. In some implementations, a high aspect ratio feature can have a height-to-width ratio of greater than or equal to about 30:1. In some embodiments, a high aspect ratio feature can have a height-to-width ratio of greater than or equal to about 40:1. In some embodiments, a high aspect ratio feature can have a height-to-width ratio of greater than or equal to about 50:1. In some embodiments, a high aspect ratio feature can have a height-to-width ratio of greater than or equal to about 60:1. For example, the length of a feature can be about 1000 nm and the width of the feature can be about 16 nm (e.g., an aspect ratio of about 62.5:1).

More specifically, the base structure can include an etch mask disposed on the target layer. In some embodiments, the target layer includes a polymer. In some embodiments, the target layer is a hardmask. In some embodiments, the target layer is a photoresist. For example, the target layer can be disposed on a dielectric layer (e.g., an oxide). In some embodiments, the target layer includes carbon. For example, the target layer can include amorphous deposited carbon, spin-on carbon, CVD deposited carbon, etc.

The etch mask can include any suitable material that enables the formation of the features from the target layer during the dry etching using thionyl chloride. In some embodiments, the etch mask is a silicon-containing etch mask. For example, the etch mask can include SiON. In some embodiments, the etch mask is a boron-containing etch mask. For example, the etch mask can include BN. In some embodiments, the etch mask is comprised within an etch mask stack including the etch mask disposed on a BARC layer. In some embodiments, providing the base structure includes forming the etch mask stack on the target layer. The BARC layer can include any suitable ARC material. In some embodiments, the photoresist is a positive photoresist. In some embodiments, the photoresist 350 is a negative photoresist.

At block 520, the target layer is dry etched using at least one process gas including thionyl chloride to obtain a processed base structure. In some embodiments, the at least one process gas is delivered within a gas mixture that further includes at least one carrier gas. In some embodiments, the at least one process gas is delivered without a carrier gas. For example, the at least one process gas can be delivered via heated gas lines. Drying etching the target layer can include bringing the etch chamber to a target temperature and pressure. More specifically, the etch chamber can be brought to the target temperature and pressure using one or more heating elements and a pump. In some embodiments, the pressure of the etch chamber may be from about 0.1 milliTorr to about 500 milliTorr, from about 1 milliTorr to about 400 milliTorr, from about 5 milliTorr to about 300 milliTorr, from about 10 milliTorr to about 200 milliTorr, from about 25 milliTorr to about 100 milliTorr, or from about 1 milliTorr to about 100 milliTorr, or any sub range or value herein. In some embodiments, the temperature of the etch chamber may be a sub-zero degree temperature. For example, the dry etching can be performed at a temperature of less than about 0° C. As another example, the dry etching can be performed at a temperature of less than or equal to about −10° C. As another example, the dry etching can be performed at a temperature of less than or equal to about −20° C. As another example, the dry etching can be performed at a temperature of less than or equal to about −30° C. As yet another example, the dry etching can be performed at a temperature of less than or equal to about −40° C. As yet another example, the dry etching can be performed at a temperature of less than or equal to about −50° C. As yet another example, the dry etching can be performed at a temperature of less than or equal to about −60° C. As yet another example, the dry etching can be performed at a temperature of less than or equal to about −70° C. As yet another example, the dry etching can be performed at a temperature of less than or equal to about −80° C. As yet another example, the dry etching can be performed at a temperature of less than or equal to about −90° C. If a carrier gas is included in a gas mixture with the process gas, then the carrier gas can propel the process gas flow into the etch chamber at a normal speed and prevent thionyl gas condensation at sub-zero degree temperatures. In some embodiments, the temperature of the etch chamber may be an above-zero degree temperature (e.g., greater than about 0° C.).

Dry etching the target layer can further include performing a dry etch process on the base structure. Examples of dry etch processes include plasma etching, ion beam milling, RIE, etc. For example, the dry etch process can include a number of dry etch pulses or cycles. Performing the dry etch process can include forming a plasma from the gas mixture including the thionyl chloride. In some embodiments, the gas mixture includes at least one additional process gas. In some embodiments, the gas mixture includes at least one carrier gas. More specifically, the at least one carrier gas may include at least one inert gas (e.g., at least one noble gas). In some embodiments, the at least one carrier gas includes Ar.

The total gas feed flow of the gas mixture can be any suitable total gas feed flow in accordance with embodiments described herein. In some embodiments, the total gas feed flow of the gas mixture is from about 50 standard cubic centimeters per minute (sccm) to about 2000 sccm, from about 100 sccm to about 1500 sccm, from about 150 sccm to about 1250 sccm, from about 200 sccm to about 1000 sccm, from about 250 sccm to about 750 sccm, or any sub range or value herein. In some embodiments, the amount of thionyl chloride in the total gas feed flow is from about 5 mol % to about 80 mol %, from about 5 mol % to about 70 mol %, from about 5 mol % to about 60 mol %, from about 5 mol % to about 50 mol %, from about 5 mol % to about 40 mol %, from about 10 mol % to about 80 mol %, from about 10 mol % to about 70 mol %, from about 20 mol % to about 70 mol %, from about 20 mol % to about 60 mol %, from about 30 mol % to about 50 mol %, or any sub range or value herein. In some embodiments, the amount of carrier gas in the total gas feed flow may be from about 5 mol % to about 15 mol %, from about 7.5 mol % to about 12.5 mol %, or from about 9 mol % to about 11 mol %, or any sub range or value herein.

Performing the dry etch process can include applying a bias power to the base structure to achieve a bias state. Any suitable bias power can be applied in accordance with embodiments described herein. In some embodiments, the bias power is from about 10 watts (W) to about 5,000 W, from about 200 W to about 2,000 W, from about 300 W to about 3,000 W, from about 400 W to about 2,500 W, from about 500 W to about 2,000 W, from about 600 W to about 1,500 W, or from about 750 W to about 1,250 W, or any sub range or value herein. A higher bias power can result in a straighter profile (e.g., more vertical profile on the trench sidewalls) with reduced profile bowing and lower selectivity to a pattern mask. The bias power may be a time-average power.

The bias frequency can be any suitable frequency in accordance with embodiments described herein. In some embodiments, the bias frequency is from about 400 kilohertz (kHZ) to about 60 megahuertz (MHz), from about 400 kHz to about 40 MHz, from about 400 kHz to about 35 MHz, from about 400 kHz to about 27 MHz, from about 400 kHz to about 20 MHz, or from about 800 kHz to about 10 MHz, or any sub range or value herein.

The bias power can be applied for any suitable time in accordance with embodiments described herein. In some embodiments, the bias power is applied from about 10 μs to about 1 ms, from about 30 μs to about 1 ms, from about 50 μs to about 1 ms, from about 70 μs to about 1 ms, or from about 85 μs to about 1 ms, or any sub range or value herein.

After stopping the bias power, performing the dry etch process can further include applying a source power to achieve a source state. Any suitable source power can be applied in accordance with embodiments described herein. In some embodiments, the source power is from about 10 W to about 5000 W, from about 200 W to about 2,000 W, from about 300 W to about 3,000 W, from about 400 W to about 2,500 W, from about 500 W to about 2,000 W, from about 600 W to about 1,500 W, or from about 750 W to about 1,250 W, or any sub range or value herein. The source power may be a time-average source power (e.g., source power times duty cycle).

The source frequency can be any suitable frequency in accordance with embodiments described herein. In some embodiments, the source frequency is about 10 MHz to about 15 MHz, or about 13 MHz, or any sub range or value herein.

The source power can be applied for any suitable time in accordance with embodiments described herein. In some embodiments, the source power can be applied from about 10 μs to about 1 ms, from about 30 μs to about 1 ms, from about 50 μs to about 1 ms, from about 70 μs to about 1 ms, or from about 85 μs to about 1 ms, or any sub range or value herein.

In some embodiments, a ratio of the first time period to the second time period is from about 1:10 to about 10:1, from about 1:9 to about 9:1, from about 1:8 to about 8:1, from about 1:7 to about 7:1, from about 1:6 to about 6:1, from about 1:5 to about 5:1, from about 1:4 to about 4:1, from about 1:3 to about 3:1, from about 1:2 to about 2:1, or about 1:1, or any sub range or value herein.

Drying etching the target layer can include determining whether a target amount of material has been removed from the target layer. If the target amount of material has not been removed from the target layer, then another dry etch cycle or pulse can be performed. If the target amount of material has been removed from the target layer, then the dry etching is complete.

For example, determining whether the target amount of material has been removed from the target layer can include checking, after each dry etch cycle or pulse, whether the target amount of material has been removed from the target layer. Additionally or alternatively, determining whether the target amount of material has been removed from the target layer can include determining whether an amount of time that the dry etching has been executed satisfies a threshold condition in accordance with an etch recipe (e.g., is greater than or equal to a target amount of time defined by the etch recipe). If the amount of time does not satisfy the threshold condition (e.g., the dry etching has not been performed for the target amount of time), then the target amount of material may not yet have been removed from the target layer. If the amount of time satisfies the threshold condition (e.g., the dry etching has been performed for the target amount of time), then this means that the target amount of material is likely to have been removed from the target layer.

In some embodiments, the target layer can have dimensions (e.g., thickness and width) to enable the formation of high aspect ratio features. Aspect ratio refers to the ratio of the height of a feature to the width of the feature (e.g., critical dimension). A feature can have any suitable aspect ratio in accordance with embodiments described herein. In some implementations, a high aspect ratio feature can have a height-to-width ratio of greater than or equal to about 30:1. In some embodiments, a high aspect ratio feature can have a height-to-width ratio of greater than or equal to about 40:1. In some embodiments, a high aspect ratio feature can have a height-to-width ratio of greater than or equal to about 50:1. In some embodiments, a high aspect ratio feature can have a height-to-width ratio of greater than or equal to about 60:1. For example, the length of a feature can be about 1000 nanometers (nm) and the width of the feature can be about 16 nm (e.g., an aspect ratio of about 62.5:1).

The features formed from the target layer can include any suitable width in accordance with embodiments described herein. In some embodiments, the width of a feature can be less than or equal to about 50 nm. In some embodiments, the width of a feature can be less than or equal to about 40 nm. In some embodiments, the width of a feature can be less than or equal to about 30 nm. In some embodiments, the width of a feature can be less than or equal to about 20 nm.

The thionyl chloride can enable self-cleaning of etch byproducts that would be formed on the sidewalls of the etch mask and/or sidewalls of features formed from the target layer. For example, if the target layer includes H (e.g., a material including C and H), then the H from the target layer can be scavenged to form HCl. The HCl can clean the etch byproducts and can smooth exposed surfaces. Moreover, the thionyl chloride can cause chemical adsorption (i.e., chemisorption) at the surface of the sidewall of features formed from the target layer, which can improve surface quality (e.g., remove surface roughness) and passivate the surface of the sidewalls of the features. For example, if the target layer is a carbon layer, then the S from the thionyl chloride can react with the C from the target layer to form a passivation layer including $CS_2$ on the surface of the sidewalls of the features. The presence of the passivation layer can reduce etching of the passivated surface and reduce a roughness of the passivated surface. The improved smoothness can lead to improved circularity of surfaces resulting from the dry etching, such as dry etching performed at sub-zero degree temperatures. Thus, the dry etching performed at block 520 with the thionyl chloride gas mixture can achieve sidewall passivation, without using an additional passivation gas, such as COS or $SO_2$. Accordingly, an improved etch profile can be achieved by performing dry etching using the thionyl chloride gas mixture at block 520.

After the dry etching is complete (e.g., after determining that the target amount of material has been removed from the target layer), the processed base structure can be removed at block 530. For example, the processed base structure can be provided into another process chamber or etch chamber for further device processing.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
   providing, within an etch chamber, a base structure comprising a target layer disposed on a substrate, and an etch mask disposed on the target layer, wherein the target layer comprises carbon;
   dry etching, within the etch chamber at a sub-zero degree Celsius temperature, the target layer using thionyl chloride to obtain a processed base structure, the processed base structure comprising a plurality of features and a plurality of openings defined by the etch mask, wherein each feature of the plurality of features has an aspect ratio greater than or equal to about 60:1; and
   removing the processed base structure from the etch chamber.

2. The method of claim 1, wherein the substrate comprises a dielectric layer, and wherein the target layer is disposed directly on the dielectric layer.

3. The method of claim 1, wherein providing the base structure comprises forming, on the target layer, an etch mask stack comprising the etch mask, and wherein the etch mask stack comprises the etch mask disposed on a bottom anti-reflective coating (BARC) layer.

4. The method of claim 1, wherein the etch mask comprises at least one of: silicon oxynitride or boron nitride.

5. The method of claim 1, wherein the target layer is a hardmask.

6. The method of claim 1, wherein the sub-zero degree Celsius temperature is less than or equal to about −10° C.

7. A method comprising:
   providing, within an etch chamber, a base structure comprising a target layer disposed on a substrate, and an etch mask disposed on the target layer; and
   dry etching, within the etch chamber at a sub-zero degree Celsius temperature, the target layer using thionyl chloride to obtain a processed base structure, the processed base structure comprising a plurality of features and a plurality of openings defined by the etch mask, wherein at least one feature of the plurality of features has an aspect ratio greater than or equal to about 60:1.

8. The method of claim 7, wherein the substrate comprises a dielectric layer, and wherein the target layer is disposed directly on the dielectric layer.

9. The method of claim 7, wherein providing the base structure comprises forming, on the target layer, an etch mask stack comprising the etch mask, and wherein the etch mask stack comprises the etch mask disposed on a bottom anti-reflective coating (BARC) layer.

10. The method of claim 7, wherein the sub-zero degree Celsius temperature is less than or equal to about −10° C.

11. The method of claim 7, wherein the etch mask comprises at least one of: silicon oxynitride or boron nitride.

12. The method of claim 7, wherein the target layer is a hardmask.

* * * * *